May 5, 1964
A. F. AUGUSTINE ETAL
3,132,307
WIDE BAND DIFFERENTIAL AMPLIFIER HAVING A D.C. DROPPING STAGE
Filed Feb. 3, 1961
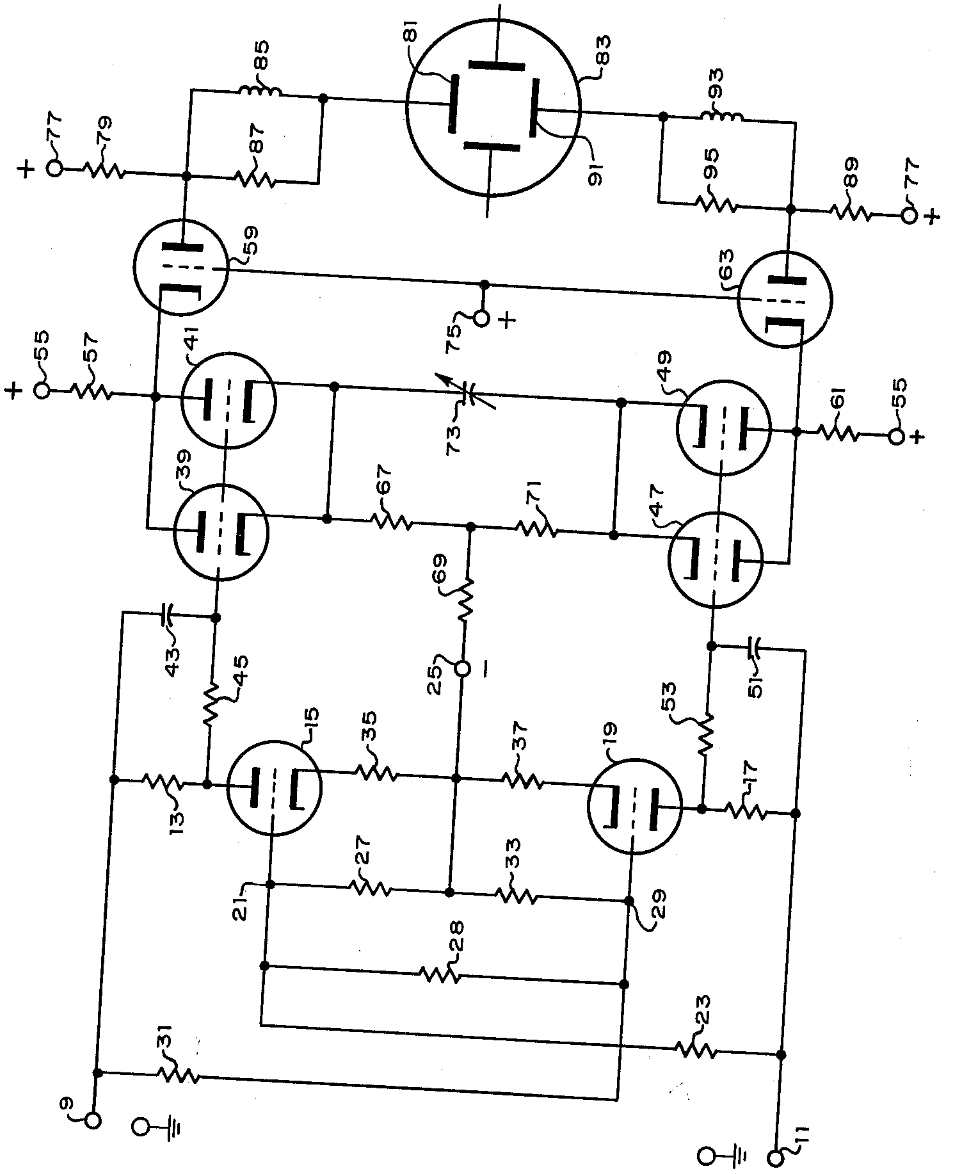
INVENTORS
ALBERT F. AUGUSTINE
RALPH H. BRITTON, JR.
BY
ATTORNEY 3,132,307

WIDE BAND DIFFERENTIAL AMPLIFIER HAVING A D.C. DROPPING STAGE

Albert F. Augustine, Mountain View, and Ralph H. Britton, Jr., Palo Alto, Calif., assignors to Hewlett-Packard Company, Palo Alto, Calif., a corporation of California Filed Feb. 3, 1961, Ser. No. 87,004
6 Claims. (Cl. 330—121)

This invention relates to oscilloscope circuits and, more particularly, to a wide-band signal processing circuit which is well suited for driving the deflection plates of a cathode ray tube.

Oscilloscopes commonly use signal circuits which have a frequency response that extends from D.-C. to frequencies of the order of several megacycles. The principal factor which limits the high frequency response of the oscilloscope is the difficulty encountered in driving the deflection plates of the cathode ray tube at high signal frequencies. As the signal frequency increases, it is necessary to increase the amplitude and power of the signal that is applied to the display tube, in order to overcome the loading effect of the parasite capacity of the cathode ray tube and its associated circuitry. Overcoming the loading effect thus serves to maintain a full-screen display pattern at high frequencies. When the desired bandwidth is of the order of 30 or 40 megacycles, conventional circuits become inadequate.

Distributed amplifiers have been used to drive the display tube at frequencies around 100 megacycles. A distributed amplifier circuit provides a means for connecting conventional amplifier tubes in parallel so that their plate currents add, but their output capacities do not. This feature is desirable for reducing the high frequency loading effect upon output signals. Thus, the bandwidth can be increased beyond the point where the individual tubes have a gain of one, which point is the high frequency limit in conventional cascaded stages. However, distributed amplifiers are quite complex and expensive and, in addition, are not generally used for low frequency applications where better results can be obtained from cascaded stages.

Direct-coupled signal stages are essential in an oscilloscope which is required to display D.-C. signals as well as high-frequency signals. Each of these stages contributes a D.-C. component to the desired signal. After the signal is processed in several such stages, it is necessary to reduce the D.-C. component and retain the signal without attenuation in order to avoid excessively high voltages at the output stages. Gas discharge tubes, Zener diodes, and other constant voltage-dropping devices are frequently used, but such devices are inherently noisy and are subject to wide variations in voltage with time and changes in temperature.

It is desirable, then, to use a signal processing circuit at frequencies of the order of 30 or 40 megacycles which is less expensive and less complex than a distributed amplifier, and which provides the required D.-C. and high-frequency signal performance. In addition, it is desirable to use a signal circuit which reduces the D.-C. component and amplifies the signal component of the signal voltage that is used to drive the display tube.

Accordingly, it is an object of the present invention to provide a wide-band signal processing circuit which is suitable for use in the deflection circuit of an oscilloscope.

It is another object of the present invention to provide a signal processing circuit which can amplify the signal component and reduce the D.-C. component of an applied signal voltage.

It is still another object of the present invention to provide a wide-band signal processing circuit which is capable of delivering high-voltage signals to the deflection plates of a cathode ray display tube in response to the waveform under examination.

In accordance with the illustrated embodiment of the present invention, a constant D.-C. voltage drop is maintained across the load resistors of the input differential signal stages. This is achieved by applying to the signal stage on one input channel, a portion of the signal appearing on the other input channel. The resulting signals appearing across the load resistors are adjusted to equal substantially the applied signals, less the D.-C. component. These signals are then applied to the second stages of the signal processing circuit. The second stage of each signal channel provides current amplification of two gain elements with the output capacity of only one gain element.

The signal voltages from the second stages of each of the signal channels are applied through suitable coupling means to the vertical deflection plates of the cathode ray tube.

Other and incidental objects of the present invention will be apparent from a reading of this specification and an inspection of the accompanying drawing which shows a schematic diagram of the signal processing circuit in accordance with the present invention.

Referring now to the drawing, two input channels are shown with input terminals 9 and 11. Load resistor 13 is connected between the plate of amplifier tube 15 and input terminal 9. Resistor 17 is connected between the plate of amplifier tube 19 and input terminal 11. The input grid 21 of amplifier tube 15 is connected to input terminal 11 through resistor 23, and is connected to a negative voltage terminal 25 of the power supply through resistor 27. The input grid 29 of amplifier tube 19 is connected to input terminal 9 through resistor 31, and is connected to negative supply terminal 25 through resistor 33. Resistor 28 is connected between grid 21 and grid 29. The cathode electrode of amplifier tube 15 is connected to the negative supply terminal 25 through resistor 35, and the cathode electrode of amplifier tube 19 is connected to the negative supply terminal 25 through resistor 37. The commonly-connected grid electrodes of amplifier tubes 39 and 41 are connected to input terminal 9 through capacitor 43 and are connected to the plate electrode of amplifier tube 15 through resistor 45. The commonly connected grid electrodes of amplifier tubes 47 and 49 are connected to input terminal 11 through capacitor 51, and are connected to plate electrode of amplifier tube 19 through resistor 53. Commonly connected plate electrodes of amplifier tubes 39 and 41 are connected to the positive terminal 55 of the power supply through resistor 57, and are connected to a cathode electrode of amplifier tube 59. The commonly connected plate electrodes of amplifier tubes 47 and 49 are connected to positive terminal 55 of the power supply through resistor 61, and are connected to the cathode electrode of amplifier tube 63. The commonly connected cathode electrodes of amplifier tubes 39 and 41 are connected to negative supply terminal 25 of the power supply through resistors 67 and 69. The commonly connected cathode electrode of amplifier tubes 47 and 49 are connected to the negative terminal 25 of the supply through resistors 69 and 71. Capacitor 73 is connected in shunt with serially connected resistors 67 and 71. The commonly connected input grid electrodes of amplifier tubes 59 and 63 are connected to positive supply terminal 75. The plate electrode of amplifier tube 59 is connected to positive supply terminal 77 through resistor 79, and is connected to the vertical deflection plate 81 of cathode ray tube 83 through the parallel combination of inductor 85 and resistor 87. The plate electrode of amplifier tube 63 is connected to positive supply terminal 77 through resistor 89, and is connected to vertical deflection plate 91 through the parallel combination of inductor 93 and resistor 95.

Differential signal from a previous stage containing a large D.-C. voltage is applied to input terminals 9 and 11. The signal appearing at terminal 11 is applied to input grid 21 of amplifier tube 15 through a first voltage divider comprising resistors 23 and 27. The signal that is applied to the input grid of amplifier tube 15 is out of phase with the signal appearing at input terminal 9. Thus, the current through amplifier tube 15 tends to increase as the voltage at terminal 9 decreases, thereby causing the voltage on the plate of amplifier tube 15 to vary in phase with the voltage appearing at input terminal 9. The voltage divider comprising resistor 23 and the combination of resistors comprising resistors 27 and 28 is chosen to provide attenuation for the signal appearing at input terminal 11 that is exactly equal to the amplification factor, $\mu$, of amplifier tube 15. This causes the plate voltage of amplifier tube 15 and the voltage appearing at input terminal 9 to vary in phase by substantially the same amounts, thereby causing a substantially constant current to flow through resistor 13. Resistor 35 provides gain degeneration for amplifier tube 15, and thereby serves to stabilize the gain of the circuit. It also serves to stabilize the D.-C. dropping characteristics of the circuit since the voltage drop across resistor 35 is made large compared with the biasing voltage of the tube. Thus, the current flowing through tube 15 is substantially independent of the tube parameters. In a similar manner, the current which flows through resistor 17 is caused to remain substantially constant, independent of applied signal. Resistors 13 and 17 are selected to provide a constant voltage drop which is substantially equal to the average value of a signal voltage appearing at input terminals 9 and 11. Resistor 28 provides adjustment of the attenuation ratios of the voltage dividers in the grid circuits of tubes 15 and 19. This resistor does not affect the signal that appears at terminals 9 and 11 in phase.

It can be seen from the above description that the voltage appearing at the plate electrodes of amplifier tubes 15 and 19 can be made substantially equal to the signal voltage appearing at input terminals 9 and 11 respectively, less the D.-C. component. Thus, no signal current flows through capacitors 43 and 51, as long as the signal voltages appearing at the terminals of the capacitors are substantially equal and in phase. At very high frequencies, when the amplification of the signal by amplifier tubes 15 and 19 is substantially reduced, the impedance of capacitors 43 and 51 becomes very small. The capacitors thus serve to conduct substantially all of the signal current. Resistors 45 and 53 serve to reduce the signal current that is drawn by amplifier tubes 15 and 19, respectively, at very high frequencies. These resistors also serve to apply the D.-C. signals appearing at the plate electrodes of amplifier tubes 15 and 19 to the grid electrodes of the following stages.

The plate current of amplifier tubes 39 and 41 flows through resistor 57 to power supply terminal 55 and through cathode follower 59 and load resistor 79 to power supply terminal 77. The plate voltages on amplifier tubes 39 and 41 are held substantially constant at the value of the voltage appearing at supply terminal 75. Thus, the signal that is applied to the grids of amplifier tubes 39 and 41 serves to vary only the plate current that flows through the tubes. The impedance that is seen by amplifier tubes 39 and 41 is substantially equal to the plate resistance of amplifier tube 59 divided by the amplification factor of the tube where the load resistor 79 is small and resistor 57 is large. This impedance, then, is substantially equal to the reciprocal of the trans conductance of amplifier tube 59. The trans conductance of an amplifier tube may be defined as the incremental change in plate current divided by the incremental change in grid voltage where the plate voltage is held constant. Thus, since the plate voltage appearing on the plate electrode of amplifier tubes 39 and 41 is held substantially fixed, as previously described, the trans conductances of amplifier tubes 39 and 41 are additive, thereby providing a much larger change in plate current for a small change in applied grid voltage. In addition, since the trans conductance of an amplifier tube is an increasing function of the plate current, it is possible to maximize the value thereof within the limits of power dissipation of the tube by increasing the value of the plate current. Resistor 57, therefore, is provided to adjust the current in the plates of amplifier tubes 39 and 41 to obtain a maximum value of trans conductance. It should be noted that this arrangement provides higher values of plate current in amplifier tubes 39 and 41, and thus higher values of trans conductance than would be possible by permitting all the plate current of amplifier tubes 39 and 41 to flow through amplifier tube 59.

The gain of the combined amplifier stages is substantially equal to the total trans conductance provided by amplifier tubes 39 and 41, multiplied by the value of of amplifier tube 59, but without the resistor 57. It should be noted that this value of gain can be made much larger than the gain obtained from a circuit containing a single tube or even two tubes connected in the cathode circuit of amplifier 59, but without the resistor 57. It should also be noted that this arrangement provides a gain of two tubes, but the output capacity of only one tube. The low output capacity permits high frequency operation without appreciable loading effect. In addition, since the plate voltages of amplifier tubes 39 and 41 are held substantially constant, the input capacity of the commonly connected amplifier tubes which is due to the Miller Effect is materially reduced. Further, it is well known to those skilled in the art that the band width of an amplifier can be extended by reducing the value of load resistance and hence reducing the maximum gain of the amplifier tube. A similar result with an additional advantage is obtained in the present circuit by increasing the value of load resistor 79 to obtain higher gain from the amplifier stage and by degenerating the gain by providing a cathode resistor 67. This provides additional gain stability at moderately low frequencies where bypass capacitor 73 has no appreciable effect. Capacitor 73, then, is chosen to bypass the degenerating effect of the cathode resistor 67 and 71 when the high frequency response begins to drop off as a result of the high frequency loading effect produced by the output capacity. The result of this arrangement is an extension of the high-frequency performance of the circuit with the added advantage of gain stability at low and at mid-band frequencies. In a similar manner, amplifier tubes 47 and 49 together with amplifier tube 63 and load resistor 89, provide high gain at very high frequencies with the output capacity, and hence the loading effect at high frequencies, of only one tube.

The signal that is available across load resistors 79 and 89 is applied to the vertical deflection plates 81 and 91, respectively, through the shunt-connected coupling elements. The value of the inductor 85 is chosen to equal the value of the parasitic capacity associated with the vertical deflection plate 81 of the cathode ray display tube 83, and the output capacity of amplifier tube 59 at the frequency at which the circuit response begins to fall off. The resonant response of the coupling circuit is overdamped by resistor 87. Thus the total response of the signal circuit is further extended by the resonant rise in response produced by inductor 85 and the parasitic capacity as seen from the terminals of inductor 85. In a similar manner, the high frequency response of the signal circuit connected to deflection plate 91 is further extended by the effect of inductor 93 and damping resistor 95.

Therefore, circuit of the present invention provides the means to apply signal voltage to the vertical deflection plates of a cathode ray tube in response to direct current or very high frequency signals. The circuit provides high frequency signal amplification of several amplifier tubes without the concomitant output capacity associated therewith. In addition, the circuit of the present invention serves to reduce the D.-C. component of the signal voltage which is used to drive the vertical deflection plates of the cathode ray tube, and which results from the directly coupled circuits which precedes the circuit of the present invention.

We claim:

1. An amplifier circuit having two signal channels and being adapted to process a pair of signals, said circuit comprising for each of said channels: an amplifier having input and output terminals, resistive means connected to said output terminal for applying thereto one of said pair of signals, means connected to said input terminal for applying thereto a portion of the other of said pair of signals to maintain the current in said resistive means constant, a utilization circuit, and means connecting the output terminal of said amplifier to said utilization circuit.

2. An amplifier circuit having two signal channels and being adapted to process of a pair of signals, each having a steady voltage component, said circuit comprising for each of said channels: an amplifier having input and output terminals and including a gain element adapted to receive bias at said output terminal, resistive means connected to said output terminals for applying one of said pair of signals thereto, the steady voltage component supplying bias for said gain element, means connected to the input terminal for applying thereto a portion of the other of said pair of signals with sufficient amplitude relative to the gain of said gain element to maintain the current in said resistive means constant, a utilization circuit, means connecting the output terminal of said amplifier to said utilization circuit, and signal conducting means to apply said one of the pair of signals to said utilization circuit.

3. An oscilloscope circuit having two signal channels and being adapted to process a pair of signals having steady voltage and alternating signal components, said circuit comprising for each of said channels: an amplifier having input and output terminals, a network including a resistor and connected to said output terminal for applying thereto the steady voltage and alternating signal components of one of said pair of signals, means connected to said input terminal for applying thereto a portion of the steady voltage and alternating signal components of the other of said pair of signals to maintain the current in said resistor constant, a utilization circuit of said oscilloscope, means including said network connected to said utilization circuit for applying thereto the steady voltage and alternating signal components of the signal appearing at the output terminal of said amplifier.

4. An oscilloscope circuit having two signal channels and being adapted to process a pair of signals having steady voltage components, said circuit comprising for each of said channels: a first amplifier having input and output terminals, resistive means connected to said output terminal for applying thereto one of said pair of signals, means connected to said input terminal for applying thereto a portion of the other of said pair of signals to maintain the current in said resistive means constant, a second amplifier, means connecting the output terminal of the first amplifier to the input of the second amplifier for applying thereto the signal appearing on the output terminal of the first amplifier, means connected to the input of the second amplifier for applying thereto said one of the pair of signals, and a utilization circuit of said oscilloscope connected to the output of said second amplifier.

5. An amplifier circuit having two signal channels for processing a pair of signals having steady voltage components of one polarity and having alternating signal components appearing in phase opposition, said amplifier circuit comprising for each of said channels an amplifier having input and output terminals and including a phase inverting gain element connected to receive bias at said output terminal, resistive means connected to said output terminal for applying thereto one of said pair of signals, the steady voltage component supplying bias for said gain element, a source of steady voltage of opposite polarity, an attenuator connected to said source and connected to receive the other of said pair of signals, the output of said attenuator being connected to the input of said amplifier, the attenuation provided by said attenuator being related to the gain of said gain element, a utilization circuit, means connecting said utilization circuit to the output terminal of said amplifier, and signal conducting means connected to said utilization circuit for applying thereto said one of the pair of signals.

6. An oscilloscope circuit having two signal channels and being adapted to process a pair of signals having steady voltage components, said circuit comprising for each of said channels: a first amplifier having input and output terminals, resistive means connected to said output terminal for applying one of said pair of signals thereto, means connected to said input terminal for applying thereto a portion of the other of said pair of signals to maintain the current in said resistive means constant, a second amplifier including at least two parallel-connected gain elements, signal conducting means connected to the input of the second amplifier for applying thereto said one of the pair of signals, means connecting the output of the first amplifier and the input of the second amplifier for applying thereto the steady voltage component of the signal appearing at the output terminal of the first amplifier, a third amplifier connected to the output of the second amplifier for conducting a portion of the current therein and for maintaining the voltage appearing at the output of the second amplifier at a substantially constant value, a utilization circuit of said oscilloscope, and means connected to the third amplifier and to the utilization circuit for applying thereto a voltage related to the amplitude of the current in the third amplifier.

References Cited in the file of this patent

UNITED STATES PATENTS

| | | |
|---|---|---|
| 2,265,780 | Schlesinger | Dec. 9, 1941 |
| 2,393,601 | Baldwin | Jan. 29, 1946 |
| 2,777,018 | Russell | Jan. 8, 1957 |
| 2,929,958 | Palmer | Mar. 22, 1960 |